United States Patent
Mukaihara et al.

[11] Patent Number: 5,914,977
[45] Date of Patent: Jun. 22, 1999

[54] SEMICONDUCTOR LASER HAVING A HIGH-REFLECTIVITY REFLECTOR ON THE LASER FACETS THEREOF, AN OPTICAL INTEGRATED DEVICE PROVIDED WITH THE SEMICONDUCTOR LASER, AND A MANUFACTURING METHOD THEREFOR

[75] Inventors: Toshikazu Mukaihara, Yokohama; Akihiko Kasukawa, Tokyo, both of Japan

[73] Assignee: The Furukawa Electric Co., Ltd., Tokyo, Japan

[21] Appl. No.: 08/949,131

[22] Filed: Oct. 10, 1997

[30] Foreign Application Priority Data

Oct. 17, 1996 [JP] Japan .................................. 8-275106

[51] Int. Cl.⁶ ...................................................... H01S 3/19
[52] U.S. Cl. .............................................. 372/50; 372/99
[58] Field of Search .............................. 372/49, 99, 96, 372/50

[56] References Cited

U.S. PATENT DOCUMENTS

| | | |
|---|---|---|
| 4,286,838 | 9/1981 | Huignard et al. .................... 372/50 |
| 4,675,873 | 6/1987 | Miller ................................. 372/99 |
| 4,845,725 | 7/1989 | Welch et al. ........................ 372/49 |
| 5,022,038 | 6/1991 | Bradley .............................. 372/50 |
| 5,185,754 | 2/1993 | Craig et al. ........................ 372/50 |

*Primary Examiner*—Rodney Bovernick
*Assistant Examiner*—Quyen Phan Leung
*Attorney, Agent, or Firm*—Frishauf, Holtz, Goodman, Langer & Chick, P.C.

[57] ABSTRACT

A reflection multilayer including low-refraction layers and semiconductor layers is formed on the facets of a semiconductor laser. The bandgap energy (Ewg) of a waveguide layer of the reflection multilayer is greater than the bandgap energy (Eac) of an active layer of the semiconductor laser (Eac<Ewg), while the thickness (Twg) of the former is smaller than the thickness (Tac) of the latter (Tac>Twg). Further, a photodetector and an optical modulator are formed on the semiconductor laser with the reflection multilayer thereon by butt-jointing or monolithically by selective vapor growth with use of selective growth masks. Relations Ewg>Emod>Eac>Epd and Twg>Tmod>Tac>Tpd are established between the respective bandgap energies and thicknesses of individual layers, whereby the absorption rate of the reflector waveguide layer and diffraction loss are lowered or reduced, and the rates of optical absorption in an optical absorption layer of the photodetector are increased.

9 Claims, 6 Drawing Sheets

(PRIOR ART)

SEMICONDUCTOR LASER HAVING A HIGH-REFLECTIVITY REFLECTOR ON THE LASER FACETS THEREOF, AN OPTICAL INTEGRATED DEVICE PROVIDED WITH THE SEMICONDUCTOR LASER, AND A MANUFACTURING METHOD THEREFOR

BACKGROUND OF THE INVENTION

1. Field of the Invention

The present invention relates to a monolithic optical integrated device having a high-reflectivity reflector with a small diffraction loss on facets of a semiconductor laser, and more particularly, to a multifunctional optical integrated device including a photodetector and an optical modulator monolithically integrated together with the semiconductor laser, and a manufacturing method therefor.

2. Description of the Prior Art

FIG. 1 shows an optical integrated device constructed so that a reflection multilayer 1b is opposed to the facets of a semiconductor laser 1a, which is composed of a pair of cladding layers and an active layer sandwiched between them. In the reflection multilayer 1b, semiconductor layers and low-refraction layers (air layers) are arranged alternately in the resonating direction of the laser. Each semiconductor layer has an element structure such that a waveguide layer is interposed between a pair of cladding layers.

This optical integrated device has a semiconductor multilayer structure such that an n-InP cladding layer 1d of 2-$\mu$m thickness, InGaAsP quantum well layer 1e of 0.3-$\mu$m thickness, p-InP cladding layer 1f of 2-$\mu$m thickness, and GaInAs cap layer 1g of 0.3-$\mu$m thickness are successively grown over an n-InP substrate 1c, for example. Regions for the semiconductor laser 1a and the reflection multilayer 1b are separated by subjecting a part of the semiconductor multilayer to dry or chemical etching in its thickness direction, and the reflection multilayer 1b is opposed to the facets of the semiconductor laser 1a at a predetermined distance therefrom.

The reflection multilayer 1b is composed of low-refraction layers or air layers 1h in regions removed by etching and semiconductor layers 1j each having a waveguide layer 1i between a pair of cladding layers 1d and 1f, the layers 1j and 1h being arranged alternately. The width (region width) of each of the layers 1h and 1j that constitute the reflection multilayer 1b is adjusted to, for example, 3$\lambda$/4, where $\lambda$ is the laser oscillation wavelength.

In the optical integrated device (semiconductor laser) constructed in this manner, the waveguide layer 1i of the reflection multilayer 1b has the same composition and thickness as the InGaAsP quantum well layer 1e of the semiconductor laser 1a. Theoretically, the reflectivity of the multilayer 1b is 92% if there are two pairs of semiconductor layers 1j and low-refraction layers 1h that constitute the layer 1b.

Since the waveguide layer 1i of the reflection multilayer 1b has the same composition as the InGaAsP quantum well layer 1e of the semiconductor laser 1a, however, an absorption loss of about 10,000 cm$^{-1}$ is caused unless current injection is carried out, for example.

In forming a practical optical module for optical communication or the like, on the other hand, the semiconductor laser 1a is provided with a photodetector. The photodetector serves to detect the output of a laser beam generated from the laser 1a, and its output is used to stabilize the oscillating operation of the laser 1a (feedback control).

As shown in FIG. 2, a photodetector 2a of this type generally has an incident-on-the-top-surface structure such that an n-InP cladding layer 2c of 2-$\mu$m thickness, InGaAsP absorption layer 2d of 2-$\mu$m thickness, p-InP cladding layer 3e of 2-$\mu$m thickness, and GaInAs cap layer 2f of 0.3-$\mu$m thickness are successively formed over an n-InP substrate 2b. The optical module is obtained by opposing the photodetector 2a to the semiconductor laser 1a at a predetermined distance therefrom, and mounting the resulting structure in a predetermined element unit.

Also, the photodetector may be monolithically integrated on the semiconductor substrate 1c on which the semiconductor laser 1a is formed. More specifically, as shown in FIG. 3, for example, a photodetector 3a may be formed by successively stacking an n-InP cladding layer 3b, InGaAsP absorption layer 3c, p-InP cladding layer 3d, and GaInAs cap layer 3e beside the semiconductor laser 1a on the n-InP substrate 1c. Actually, the semiconductor laser 1a and the photodetector 3a are formed by dividing their respective regions in a manner such that the semiconductor multilayer on the n-InP substrate 1c is partially removed by etching.

In the optical module (optical integrated device) of this monolithic structure, however, the InGaAsP quantum well layer (laser active layer) 1e of the semiconductor laser 1a and the InGaAsP absorption layer (optical absorption layer) 3c of the photodetector 3a have the same composition and thickness, so that the laser beam emitted from the laser 1a and the photodetector 3a cannot be optically coupled with high efficiency (optical coupling efficiency is low). Since the photodetector 3a is opposed to the end face of the semiconductor laser 1a across the air layers (low-refraction layers), moreover, there is a substantial diffraction loss of light.

SUMMARY OF THE INVENTION

An object of the present invention is to provide a semiconductor laser, in which the diffraction loss in a reflector region on its facets is lowered, and the reflectivity of the reflector region is enhanced, and which ensures low power consumption and low threshold oscillation current.

Another object of the invention is to provide a multifunctional optical integrated device, in which a photodetector and an optical modulator are monolithically integrated with a semiconductor laser, and also to provide an optical integrated device of an element structure such that the absorption efficiency and coupling efficiency for the photodetector and the optical modulator are improved.

Still another object of the invention is to provide a semiconductor laser and an optical integrated device, in which the absorption loss in a reflector region is reduced to about 10 cm$^{-1}$, the optical confinement coefficient for the reflector region is lowered, and the diffraction loss is reduced by increasing the spot size.

A further object of the invention is to provide a multifunctional optical integrated device suited for high-speed-modulation, large-capacity optical communication, in which a photodetector and an optical modulator are monolithically integrated together with a semiconductor laser so that the cost is reduced, the coupling efficiency for the semiconductor laser and the photodetector is improved, and the optical modulator is integrated in one, and also to provide a manufacturing method for an optical integrated device, capable of easily manufacturing the device with high accuracy.

According to the present invention, there is provided an optical integrated device, which comprises a semiconductor laser including an active layer interposed between a pair of cladding layers, and a reflector provided on the facets of the semiconductor laser and formed of a reflection multilayer obtained by alternately arranging semiconductor layers, each including a waveguide layer interposed between a pair of cladding layers, and low-refraction layers, the bandgap energy (Ewg) of the waveguide layer being greater than the bandgap energy (Eac) of the active layer (Eac<Ewg). Thus, according to the invention, the bandgap energy Ewg of the reflector region composed of the semiconductor layers and the low-refraction layers is made greater than the bandgap energy Eac of the laser active layer. By doing this, the optical absorption loss in the semiconductor waveguide layer of the reflection multilayer is reduced considerably, so that the reflectivity of the reflector can be enhanced, and the semiconductor laser can enjoy lower power consumption and low threshold oscillation current.

According to the invention, moreover, there is provided an optical integrated device of an element structure such that the thickness (Twg) of the waveguide layer is smaller than the thickness (Tac) of the active layer (Tac>Twg). More specifically, the optical confinement coefficient for a laser beam in the reflector is lowered by making the thickness Twg of the reflector region smaller than the thickness Tac of the laser active layer region, whereby the reflectivity is enhanced to ensure low power consumption and low threshold oscillation current for the semiconductor laser.

Preferably, the respective thicknesses of the low-refraction layers and the semiconductor layers constituting the reflection multilayer are adjusted to about $(2N+1)\lambda/4n$ (where n is the refractive index of a medium, $\lambda$ is a wavelength, and N is an integer) each so that the reflectivity of the reflector is high enough.

According to the invention, furthermore, there is provided an optical integrated device of an element structure such that the bandgap energy Eac of the active layer is made smaller than the bandgap energy Ewg of the waveguide layer (Eac<Ewg), and the thickness Tac of the active layer is made greater than the thickness Twg of the waveguide layer (Tac>Twg), in forming the semiconductor laser and the reflection multilayer are formed on a single semiconductor substrate.

According to the present invention, moreover, there is provided a method for manufacturing the optical integrated device, which comprises providing a pair of selective growth masks only on either side of a region in which the semiconductor laser on a single semiconductor substrate is to be formed and forming semiconductor layers on the semiconductor substrate by selective vapor growth with use of the selective growth masks, thereby easily accurately forming the active layer and the waveguide layer with the bandgap energies set in the aforesaid manner.

Alternatively, the manufacturing method according to the invention comprises providing a pair of first selective growth masks on either side of the region in which the semiconductor laser on the semiconductor substrate is to be formed, providing a pair of second selective growth masks narrower than the first selective growth masks on either side of a region in which the reflection multilayer on the semiconductor substrate is to be formed, and forming semiconductor layers on the substrate by selective vapor growth with use of the first and second selective growth masks, thereby forming the active layer and the waveguide layer with the bandgap energies set in the aforesaid manner.

According to the invention, moreover, there is provided an optical integrated device in which a photodetector including an optical absorption layer interposed between a pair of cladding layers is monolithically integrated on the semiconductor substrate. In particular, the bandgap energy (Epd) of the optical absorption layer is made smaller than the respective bandgap energies (Eac, Ewg) of the active layer and the waveguide layer (Ewg>Eac>Epd), and the thickness (Tpd) of the optical absorption layer is made greater than the respective thicknesses (Tac, Twg) of the active layer and the waveguide layer (Twg<Tac<Tpd). Thus, the optical integrated device is provided with the semiconductor laser and the high-sensitivity photodetector.

In manufacturing the optical integrated device with this element structure, a pair of first selective growth masks and a pair of third selective growth masks are provided on either side of regions in which the semiconductor laser and the photodetector on the semiconductor substrate are to be formed, respectively, without masking the opposite sides of a region in which the reflection multilayer on the semiconductor substrate is to be formed, and semiconductor layers are formed on the semiconductor substrate by selective vapor growth with use of the first and third selective growth masks, whereby the active layer, waveguide layer, and optical absorption layer are formed. In this case, in particular, the width (Wld) of the first selective growth masks is made smaller than the width (Wpd) of the third selective growth masks (Wld<Wpd) so that the bandgap energy Epd of the optical absorption layer is smaller than the respective bandgap energies Eac and Ewg of the active layer and the waveguide layer (Ewg>Eac>Epd), and that the thickness Tpd of the optical absorption layer is greater than the respective thicknesses Tac and Twg of the active layer and the waveguide layer (Twg<Tac<Tpd).

According to the present invention, furthermore, there is an optical integrated device of an element structure such that an optical modulator including an optical attenuation layer interposed between a pair of cladding layers is monolithically integrated on the semiconductor substrate. In this case, the bandgap energy (Emod) of the optical attenuation layer is made greater than the bandgap energy Eac of the active layer and smaller than the bandgap energy Ewg of the waveguide layer (Ewg>Emod>Eac), and the thickness (Tmod) of the optical attenuation layer is made smaller than the thickness Tac of the active layer and greater than the thickness Twg of the waveguide layer (Twg<Tmod<Tac).

In manufacturing the optical integrated device with this element structure, a pair of first selective growth masks and a pair of fourth selective growth masks are provided on either side of regions in which the semiconductor laser and the modulator are to be formed, respectively, without masking the opposite sides of a region in which the reflection multilayer on the semiconductor substrate is to be formed, and semiconductor layers are formed on the semiconductor substrate by selective vapor growth with use of the first and fourth selective growth masks, whereby the active layer, waveguide layer, and optical attenuation layer are formed. In this case, in particular, the width Wld of the first selective growth masks is made greater than the width Wmod of the fourth selective growth masks (Wmod<Wld) so that the optical integrated device is provided with the active layer, waveguide layer, and optical attenuation based on the relations Ewg>Emod>Eac and Twg<Tmod<Tac.

Thus, according to the present invention, there is provided a multifunctional optical integrated device in which a semiconductor laser, having a high-reflectivity reflection multilayer including semiconductor layers and low-refraction layers on its facets, is formed by butt-jointing without interposition or by effectively combining the selective vapor growth technique and a low-loss etching process, and a photodetector, optical modulator, etc. are integrated monolithically. According to the invention, in particular, the threshold oscillation current for the semiconductor laser is lowered by enhancing the reflectivity of the reflection multilayer composed of the semiconductor layers and the low-refraction layers, the optical sensitivity of the structure integrating the semiconductor laser and the photodetector is improved, and the optical modulator is integrated together with the low-threshold-current semiconductor laser and the high-sensitivity photodetector.

DETAILED DESCRIPTION OF THE INVENTION

Several embodiments of an optical integrated device according to the present invention will now be described with reference to the accompanying drawings.

An optical integrated device according to an embodiment of the invention comprises a semiconductor laser and a reflector region on the facets of the laser, which are each formed basically as a semiconductor multilayer of an element structure such that, for example, an n-InP cladding layer, InGaAsP active layer (waveguide layer), p-InP cladding layer, and p-GaInAs cap layer are successively stacked over an n-InP substrate by the metal organic chemical vapor deposition (MOCVD) method. Also, the optical integrated device of the present embodiment may be realized by further monolithically forming a photodetector and a modulator on the n-InP substrate on which the semiconductor laser is formed.

In forming the semiconductor multilayer of the reflector region, the semiconductor multilayer of the aforesaid element structure is first selectively etched with use of a mask formed of, for example, an SiN film. Then, a similar semiconductor multilayer is formed again on the n-InP substrate, which is exposed by etching, by the MOCVD method in a manner such that it is butt-jointed to the functional device (semiconductor laser) remaining on the n-InP substrate without any interposition. This newly formed semiconductor multilayer serves as the reflector region that is coupled to the functional device (semiconductor laser).

Also, the optical integrated device may be obtained by growing a semiconductor multilayer on the n-InP substrate by selective vapor growth using a selective growth mask formed of, e.g., an SiN film, at a growing speed corresponding to the width of the mask, instead of forming the aforesaid butt-joint structure. More specifically, a semiconductor multilayer whose thickness varies with every mask region may be formed by selective vapor growth using the selective growth mask so that the semiconductor laser and the reflector region are formed simultaneously. Further, the photodetector and the modulator may be formed simultaneously in the same manner.

FIGS. 5A to 5D show a first embodiment of the present invention, illustrating the element structure of an optical integrated device having a reflection multilayer, formed of low-refraction layers and semiconductor layers, on the facets of a semiconductor laser, and processes of manufacturing the device.

Figure 5A:
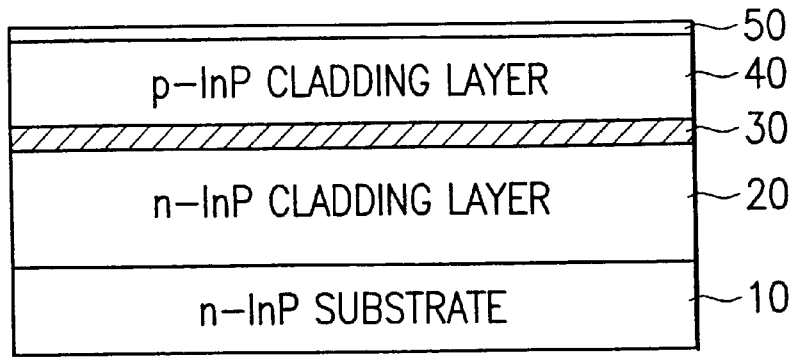
FIG. 5A is a view showing a manufacturing process for an optical integrated device according to a first embodiment of the present invention, in which a semiconductor multilayer is formed on an n-InP substrate by the MOCVD method.

In forming the semiconductor laser, as shown in FIG. 5A, a semiconductor multilayer to serve as the semiconductor laser is first epitaxially grown on an n-InP substrate 10 by the metal organic chemical vapor deposition (MOCVD) method. More specifically, an n-InP cladding layer 20 of 2-μm thickness is grown on the substrate 10. Then, an InGaAsP active layer 30 of 0.3-μm thickness, as a laser active layer including a strain quantum well and an optical confinement layer, is grown on the cladding layer 20. Thereafter, a p-InP cladding layer 40 of 2-μm thickness is grown on the active layer 30, and a p-GaInAs cap layer 50 of 0.3-μm thickness is further grown on the cladding layer 40.

Figure 5B:
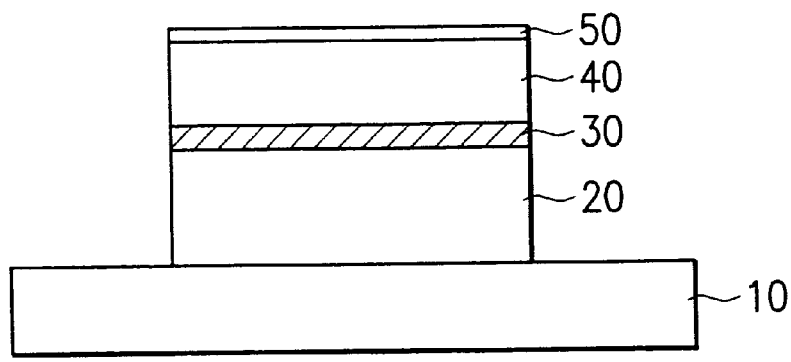
FIG. 5B is a view showing the semiconductor multilayer formed on the n-InP substrate shown in FIG. 5A, with the whole area except a region for the formation of a semiconductor laser removed by etching.

Subsequently, an etching mask of, e.g., SiN is formed on the p-GaInAs cap layer 50 so as to correspond to that region of the semiconductor multilayer on which the semiconductor laser is to be formed. As shown in FIG. 5B, thereafter, an unmasked region of the semiconductor multilayer is removed by chemical or dry etching with use of the etching mask. The removal of the semiconductor multilayer by etching is continued so that the n-InP substrate 10 is exposed.

Figure 5C:
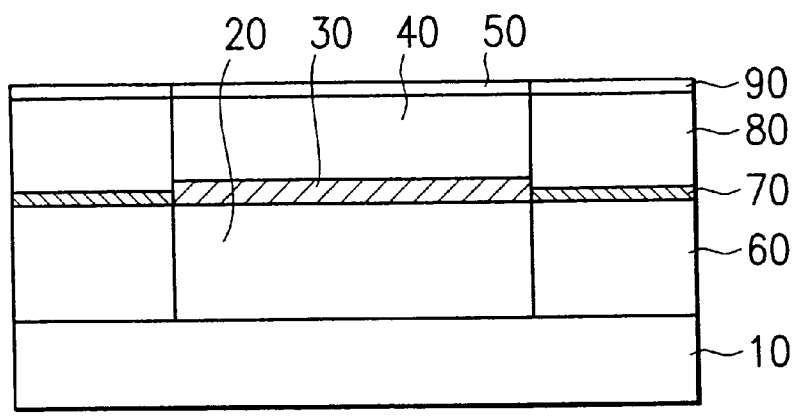
FIG. 5C is a view showing semiconductor layers formed on the n-InP substrate by vapor growth so as to be butt-jointed to the semiconductor laser on the substrate.

Then, as shown in FIG. 5C, a semiconductor multilayer to serve as a base of the reflection multilayer including the low-refraction layers and the semiconductor layers (mentioned later) is formed having a butt-joint structure by the MOCVD method, on that region of the n-InP substrate 10 in which the aforesaid semiconductor multilayer is removed by etching. In forming this semiconductor multilayer, an n-InP cladding layer 60 of 2-μm thickness is first formed on the n-InP substrate 10. Then, an InGaAsP waveguide layer 70, including a strain quantum well and a laser beam confinement layer, is deposited to a thickness of 0.1 μm on the cladding layer 60. Thereafter, a p-InP cladding layer 80 of 2-μm thickness is formed on the waveguide layer 70, and a p-GaInAs cap layer 90 of 0.3-μm thickness is further formed on the cladding layer 80.

In this case, the bandgap energy (Ewg) of the InGaAsP waveguide layer 70, which serves as the reflector waveguide layer, is set so as to be greater than that (Eac) of the InGaAsP active layer 30 to form the laser active layer (Eac<Ewg). Owing to this relation, it is difficult for a laser beam emitted from the laser active layer 30 to be absorbed by the reflector region (waveguide layer), and the reflectivity of the reflection multilayer, formed with this semiconductor multilayer as its base and composed of the low-refraction layers and the semiconductor layers (mentioned later), is enhanced.

In this case, the thickness (Twg) of the InGaAsP waveguide layer 70 is set so as to be smaller than that (Tac) of the InGaAsP active layer 30 (Tac>Twg). More specifically, the thickness Twg of the waveguide layer 70 in the region that forms a reflector is set at 0.1 μm, compared to the thickness Tac of 0.3 μm for the active layer 30 that forms a cavity of the semiconductor laser, as mentioned before. The laser beam confinement coefficient for the reflector region can be lowered by making the waveguide layer 70 thus thin. Further, the spot size of the laser beam in the reflector region is increased. This results in a reduction of a diffraction loss in the reflection multilayer including the semiconductor layers and the low-refraction layers, which are formed in the following manner. Also, the reflectivity of the reflection multilayer can be enhanced.

Figure 5D:
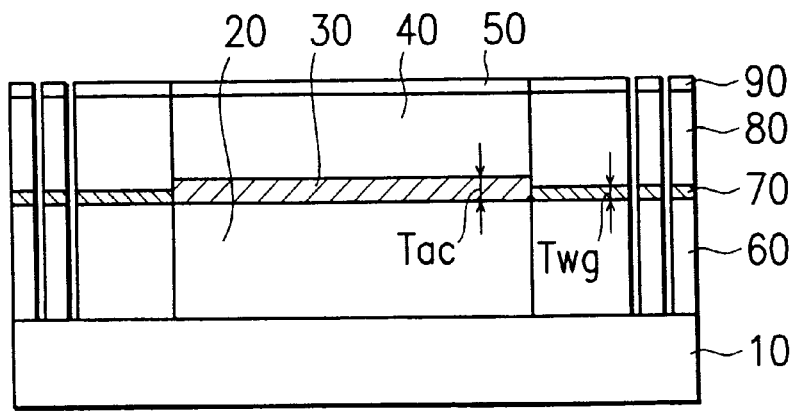
FIG. 5D is a view showing reflection multilayers provided individually on the facets of the semiconductor laser by etching the semiconductor layers shown in FIG. 5C.

After the semiconductor multilayer for the reflector region is formed in the aforesaid manner by the MOCVD method, it is then etched to form air layers that form the low-refraction layers, as shown in FIG. 5D, whereupon the reflection multilayer including the semiconductor layers and the low-refraction layers is obtained. This reflection multilayer is formed in a position where the spot size of the laser beam emitted from a laser active region of the semiconductor laser, that is, the InGaAsP active layer 30, is large enough, e.g., a position at a distance of 100 μ from the facets.

In forming the reflection multilayer, an SiN film is first formed on the p-GaInAs cap layers 50 and 90 of the wafer composed of the multilayer in the aforesaid manner. This SiN film is exposed to an electron beam, whereupon apertures having a predetermined stripe width are formed in the regions for the low-refraction layers. In forming a reflection multilayer including two pairs of semiconductor layers and low-refraction layers individually on the opposite end faces of the semiconductor laser, for example, the apertures having the predetermined stripe width are formed at pitches of 1.25 μm.

In general, the reflection multilayer is formed having a small thickness, in order to restrain the absorption loss of the reflector. However, the reflection multilayer according to the present invention, composed of the low-refraction layers and the semiconductor layers, can enjoy a relatively large thickness, since an optical absorption loss in its semiconductor layers is small. Accordingly, the reflector can be worked with ease. In order to reduce the diffraction loss, in general, the thickness of the low-refraction layer regions is set at λ/4. According to the invention, however, the diffraction loss is reduced by increasing the spot size of the laser beam in the reflector waveguide, so that the low-refraction layer regions can be made relatively thick. Also on account of this, the low-refraction layer regions of the reflector can be worked easily.

The semiconductor multilayer is removed by the reactive-ion etching (RIE) method using the SiN film, having the stripe-shaped apertures formed by means of the electron beam, as a mask. In this partial etching of the semiconductor multilayer, the GaInAs cap layer 90 is first etched in tartaric acid, and the p-InP cladding layer 80 is then etched in an etching agent formed of a one-to-three mixture of hydrochloric acid and phosphoric acid, for example. Further, the waveguide layer 70 and the n-InP cladding layer 60 are etched in hydrochloric acid.

After the etching in hydrochloric acid, the remaining multilayer regions (semiconductor layers) are generally inverted-mesa-shaped, and their reflectivity is lowered due to a scattering loss. After the aforesaid treatment with hydrochloric acid, therefore, light etching is carried out with use of a one-to-two mixture of hydrochloric acid and nitric acid, thereby ensuring the perpendicularity of the etching surface of the reflector configuration. Thus, the reflectivity of the surface is improved.

According to the semiconductor laser manufactured in this manner, the reflector formed on the facets is composed of the low-refraction layers or air layers with a refractive index of 1, in the regions formed by selectively removing the semiconductor multilayer by etching, and the remaining semiconductor layer regions. The absorption loss can be reduced to a level as low as 10 $cm^{-1}$ if the reflection multilayer includes the low-refraction layers and the semiconductor layers in two pairs, with the semiconductor layers having a refractive index of 3.5 and with each of the low-refraction layers and the semiconductor layers having a width of 3λ/4. Also, the reflectivity can be elevated to 99% if the spot size of the emitted laser beam is increased to 3 μm with the diffraction loss reduced. Thus, there may be provided a semiconductor laser with a high-reflectivity reflector.

Electrodes of the semiconductor laser can be obtained by, for example, depositing Ti/Pt/Au and AuGe/Au on the p-side (p-GaInAs cap layer 50) and n-side (back of n-InP substrate 10), respectively, of the laser. The reflection multilayer is not bound to be formed on either end face of the semiconductor laser, and may alternatively be formed on one end face only. Moreover, a ridge waveguide may be formed in the cavity region of the semiconductor laser. It was confirmed that the threshold oscillation current can be lowered to 8.5 mA if the semiconductor laser has an element structure such that the ridge waveguide width is 3 μm, the cavity length is 150 μm, and the reflection multilayer (reflector) on each end face has a high reflectivity of 99%.

The element structure is not limited to the ridge-waveguide type, and an embedded waveguide may be formed. It was confirmed that the threshold oscillation current can be lowered to a level as low as 3 mA if the semiconductor laser has an element structure such that the embedding width of the waveguide is 1 μm, the cavity length is 150 μm, and the reflection multilayer on each end face has a high reflectivity of 99%.

The following is a description of a manufacturing method according to a second embodiment of the present invention. According to this method, a reflector composed of low-refraction layers and semiconductor layers is formed integrally with the facets of a semiconductor laser by the selective vapor growth technique using a selective growth mask.

Figure 6A:
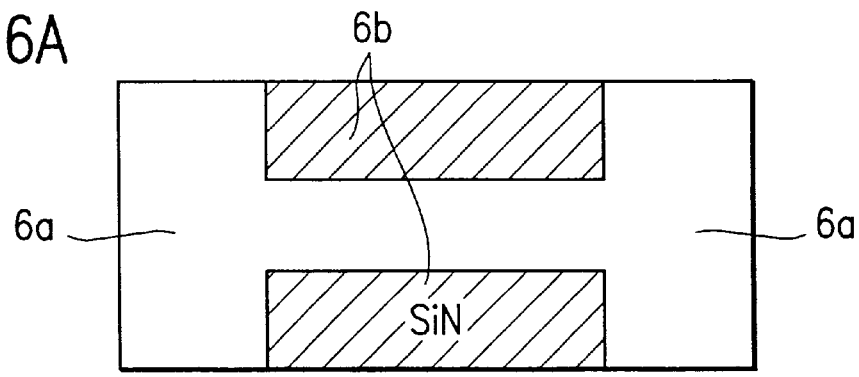
FIG. 6A is a view showing an example of a pattern of a selective growth mask used in selective vapor growth of a semiconductor multilayer in a manufacturing method for an optical integrated device according to a second embodiment of the invention.
Figure 6B:
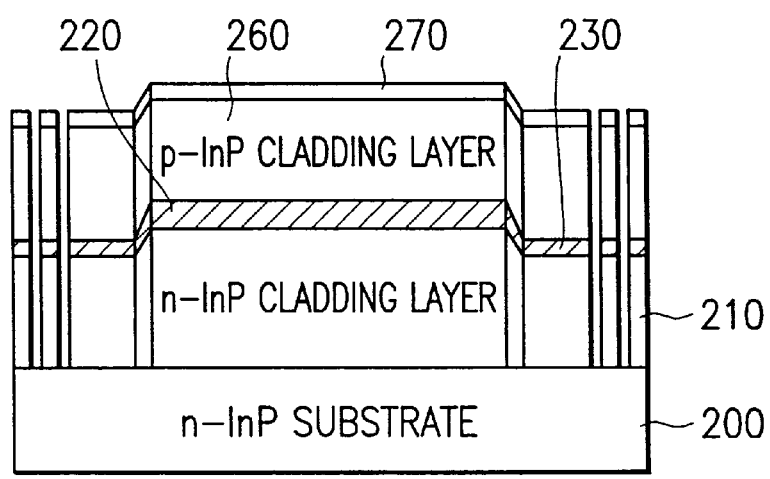
FIG. 6B is a view showing an element structure of the semiconductor laser with reflection multilayers on its facets, formed by the selective growth technique using the selective growth mask shown in FIG. 6A.

FIGS. 6A and 6B show an outline of the manufacturing method. First, a selective growth mask of SiN with a thickness of 100 nm is formed on an n-InP substrate 200, as shown in FIG. 6A. The mask, as shown in FIG. 6A, is composed of a mask pattern including no-mask portions 6a in a region where reflectors are to be formed and mask portions 6b on either side of a region where semiconductor lasers are to be formed. Thus, a pair of selective growth masks of an SiN film are formed only on either side of the region where the semiconductor lasers are to be formed.

Alternatively, a pair of first selective growth masks may be formed individually on the opposite sides of the region for the formation of the semiconductor lasers. In this case, a pair of narrower second selective growth masks are formed in the region for the formation of the reflectors.

Thereafter, the semiconductor layers are successively grown in the region for the formation of the semiconductor lasers between the pair of selective growth masks in the mask portions 6b by the MOCVD method using the SiN film as the selective growth masks, as shown in FIG. 6B, for example. This is done in a manner such that the thicknesses of an n-InP cladding layer 210, an InGaAsP semiconductor layer including a (strain) quantum well and an optical confinement layer, a p-InP cladding layer 260, and a p-GaInAs cap layer 270 are 2 μm, 0.3 μm, 2 μm, and 0.3 μm, respectively. Due to a difference in the vapor growth rate that depends on the width of the selective growth masks, in this case, the bandgap energy (Eac) of a laser active layer formed of the InGaAsP layer 220 grown in the region for the formation of the semiconductor lasers is smaller than that (Ewg) of a reflector waveguide layer 230 formed of the InGaAsP layer grown in the no-mask region for the formation of the reflectors.

Owing to this relation (Eac<Ewg), it is difficult for a laser beam emitted from the laser active layer formed of the InGaAsP layer 220 to be absorbed by the reflectors. As a result, the reflectivity of reflection multilayers (including semiconductor layers and low-refraction layers) formed in the reflector region can be made high enough, so that high-reflectivity reflectors can be obtained. The reflectors can be realized as the reflection multilayers, composed of the semiconductor layers and the low-refraction layers, in a manner such that the semiconductor multilayer grown in the region for the formation of the reflectors are etched and the air layers as the low-refraction layers are formed in the same manner as in the foregoing embodiment.

Due to the difference in the vapor growth rate, in this case, the thickness (Twg) of the reflector waveguide layer 230 formed in the region for the formation of the reflectors by the selective growth technique using the selective growth mask is 0.1 μm, which is smaller than the thickness (Tac=0.3 μm) of the laser active layer formed of the InGaAsP layer 220 in the region for the formation of the semiconductor lasers. Owing to this relation (Tac<Twg), the optical confinement coefficient for the reflector waveguide layer 230 is lowered. As a result, the spot size of the laser beam in the waveguide layer 230 is increased with the diffraction loss in the reflectors reduced, so that the reflectivity of reflectors can be enhanced satisfactorily.

The reflection multilayer is formed in a region where the spot size is large enough, e.g., a position at a distance of 100 μm from the region (facets) for the formation of the semiconductor lasers. It was confirmed that the reflectivity of the reflection multilayer can-be adjusted to 99% for the semiconductor laser in which the reflection multilayer composed of the semiconductor layers and the low-refraction layers is formed by etching and which is provided with a ridge waveguide of 3-μm width.

The following is a description of an optical integrated circuit according to a third embodiment of the present invention. In this integrated circuit, a photodetector for monitoring the output of a semiconductor laser is monolithically integrated together with the laser on one and the same semiconductor substrate, the laser including a reflection multilayer composed of semiconductor layers and low-refraction layers on its facets.

Figure 7:
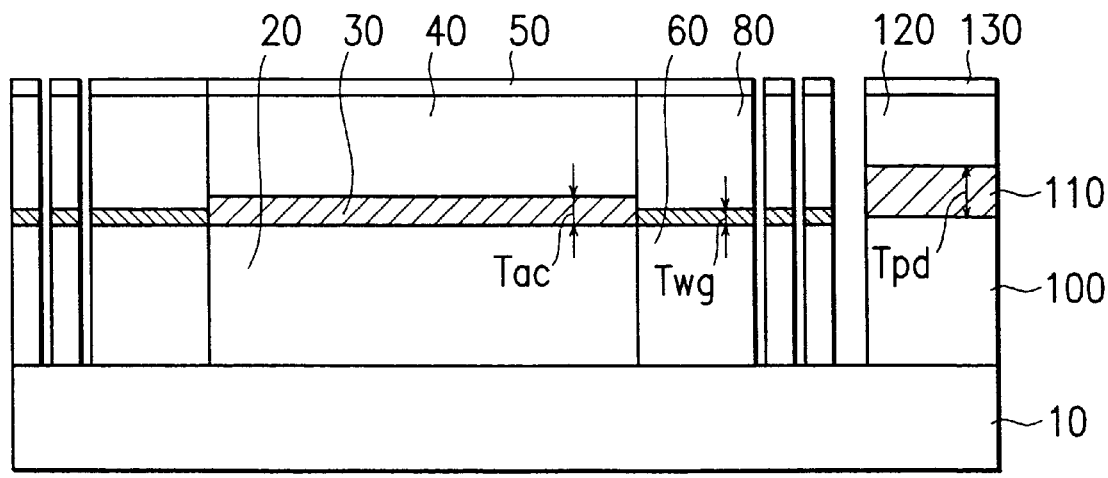
FIG. 7 is a view showing an optical integrated device according to a third embodiment of the invention, composed of a semiconductor laser with a photodetector monolithically integrated with a butt-joint structure on a single semiconductor substrate.

In manufacturing this optical integrated circuit, as shown in FIG. 7, for example, the semiconductor laser is first formed on an n-InP substrate 10, with the reflection multilayer on its facets. More specifically, a semiconductor multilayer is first formed on the n-InP substrate 10 by the MOCVD method, as described before with reference to FIGS. 5A to 5D, and the reflection multilayer is formed so as to be butt-jointed to the end face of the semiconductor multilayer. Then, the semiconductor laser (laser cavity) and those regions of the semiconductor multilayer which are to form reflectors are masked with an SiN film, and the remaining region of the semiconductor multilayer to form the photodetector is removed to expose the n-InP substrate 10 by etching.

Thereafter, a semiconductor multilayer to form a photodetector region is grown again with a butt-joint structure on the exposed n-InP substrate 10 by the MOCVD method.

In growing the semiconductor multilayer to form the photodetector region, for example, an n-InP cladding layer 100 of 2-μm thickness is first grown on the n-InP substrate 10, and an optical absorption layer 110 of 0.5-μm thickness, p-InP cladding layer 120 of 2-μm thickness, and p-GaInAs cap layer 130 of 0.3-μm thickness are then successively grown over the cladding layer 100. In this case, the bandgap energy (Epd) of the optical absorption layer 110 is set so as to be smaller than that (Eac) of the aforesaid laser active layer 30. Since the bandgap energy Ewg of the reflector waveguide layer 70 is greater than that (Eac) of the active layer 30 (Ewg>Eac), as mentioned before, the respective bandgap energies of these layers have relations Ewg>Eac>Epd.

According to the optical integrated device in which the respective bandgap energies Ewg, Eac and Epd of the individual layers have the aforesaid relations Ewg>Eac>Epd, the bandgap energy Epd of the optical absorption layer 110 of the photodetector has the smallest value, so that the laser beam emitted from the laser active layer 30 can be efficiently absorbed by the photodetector. As a result, the photodetector can enjoy a satisfactory photocurrent, and its sensitivity can be improved.

Since the thicknesses Twg, Tac and Tpd of the reflector waveguide layer 70, laser active layer 30, and photodetector absorption layer 110 are adjusted to 0.1 μm, 0.3 μm, and 0.5 μm, respectively, they have relations Twg<Tac<Tpd. As a result, the spot size of the laser beam delivered from the laser active layer 30 and introduced into the reflector waveguide layer 70 is increased, so that a far field image of the beam can be reduced in size, and the laser beam transmitted through the reflector region can be efficiently coupled to the absorption layer 110 of the photodetector. Also on account of this, the photodetector can enjoy a satisfactory photocurrent, and its sensitivity can be improved.

The reflection multilayer is not bound to be formed on either end face of the semiconductor laser, and may alternatively be formed on one end face only. It is to be desired, however, that the reflectivity of the reflector on the photodetector side should be set at a moderate value, not very high, in order to obtain a satisfactory photocurrent. In this case, the reflectivity can be adjusted by, for example, changing the number of pairs of semiconductor layers and low-refraction layers that constitute the reflection multilayer. Although the reflectivity of the aforementioned reflection multilayer that includes the air layers and the semiconductor layers in two pairs is 99%, it can be adjusted to 91% by reducing the pair number to one.

In this case, moreover, the efficiency of light reception of the photodetector can be easily improved by making the width of the ridge waveguide in the photodetector greater than that of the ridge waveguide in the laser region so that an optical absorption region in the photodetector is wide. In the case where the semiconductor laser has a cleavage plane on its emission side, the photodetector can enjoy a monitor current of 0.35 mA when the laser output is at 5 mW.

Figure 8A:
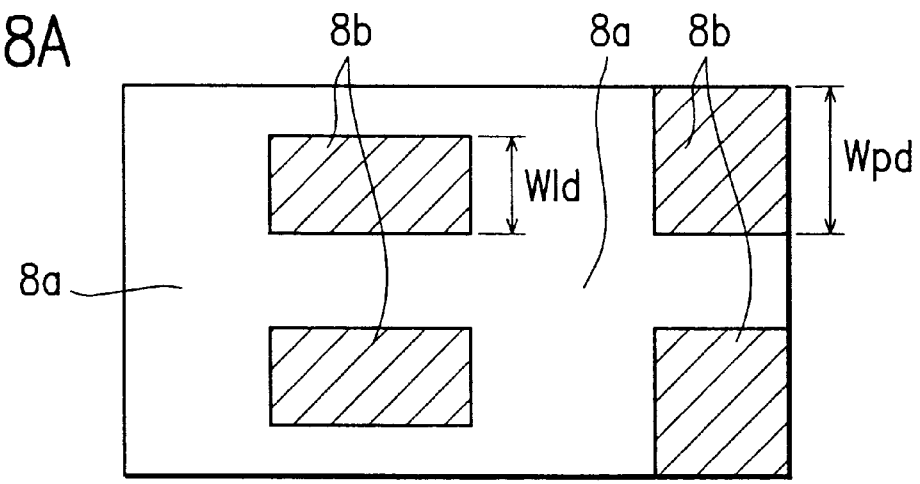
FIG. 8A is a view showing an example of a pattern of a selective growth mask used in selective vapor growth of a semiconductor multilayer in a manufacturing method for an optical integrated device according to a fourth embodiment of the invention.
Figure 8B:
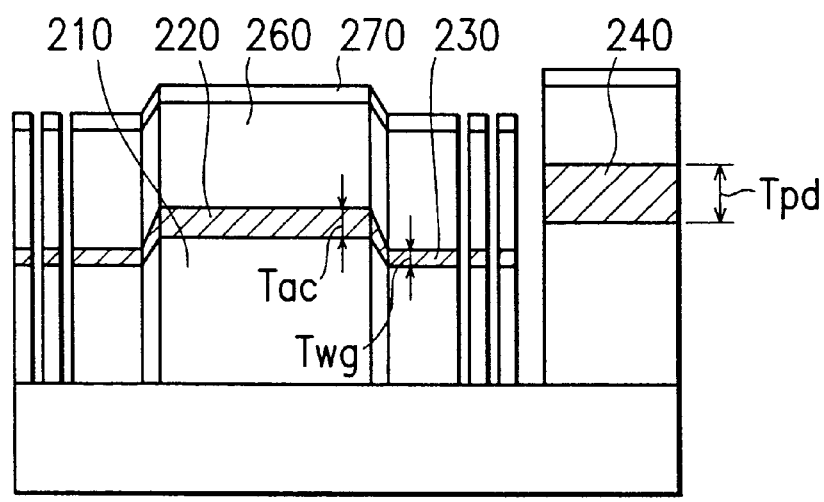
FIG. 8B is a view showing an arrangement of the optical integrated device composed of a semiconductor laser with a photodetector, formed by the selective growth technique using the selective growth mask shown in FIG. 8A.

As mentioned before, the photodetector can be formed by the selective vapor growth technique using a selective growth mask. FIGS. 8A and 8B show an example of an optical integrated device according to a fourth embodiment of the present invention.

In manufacturing this optical integrated device, a selective growth mask of SiN with a thickness of 100 nm is first formed on an n-InP substrate 200. As shown in FIG. 8A, the mask is composed of a mask pattern including no-mask portions 8a in a region where reflectors are to be formed, first mask portions 8b in a region where semiconductor lasers are to be formed, and second mask portions 8c in a region where photodetectors are to be formed. The first mask portions 8b, in particular, are provided individually with a pair of first selective growth masks with a width Wld on either side of the region for the formation of the semiconductor lasers, while the second mask portions 8c are provided individually with a pair of third selective growth masks with a width Wpd on either side of the region for the formation of the photodetectors. The respective widths Wld and Wpd of the first and third selective growth masks have a relation Wpd>Wld, that is, the masks on the photodetector side are wider.

Also in this case, a pair of second selective growth masks that are narrower than the first ones may be arranged with the region for the formation of the reflectors between them.

Thereafter, a semiconductor multilayer is grown by the MOCVD method using the aforesaid mask, as shown in FIG. 8B. In growing this semiconductor multilayer, the n-InP cladding layer 210 of 2-μm thickness, the InGaAsP layer 220 of 0.3-μm thickness, including the strain quantum well and the optical confinement layer, the p-InP cladding layer 260 of 2-μm thickness, and the p-GaInAs cap layer 270 of 0.3-μm thickness are successively grown the n-InP substrate 200, in the region for the formation of the semiconductor lasers, for example.

Due to a difference in the vapor growth rate that depends on the aforesaid mask widths Wpd and Wld, there are differences between the respective bandgap energies Ewg, Eac and Epd of the reflector waveguide layer 230, the laser active layer 220, and a photodetector absorption layer 240 (Ewg>Eac>Epd). As a result, the laser beam emitted from the laser active layer 220 can be efficiently absorbed by the photodetector 240, so that a satisfactory photocurrent can be obtained.

Due to the difference in the vapor growth rate that depends on the aforesaid mask widths Wpd and Wld, moreover, there are differences between the respective thicknesses Twg, Tac and Tpd of the layers 230, 230 and 240. More specifically, if the laser active layer 220 is grown to the thickness Tac of 0.3 μm, as mentioned before, the thicknesses Twg and Tpd of the reflector waveguide layer 230 and the photodetector absorption layer 240 are 0.1 μm and 0.5 μm, respectively, for example. Thus, the respective thicknesses Twg, Tac and Tpd of the layers have relations Twg<Tac<Tpd.

As a result, the spot size of the laser beam in the reflector waveguide layer 230 is increased, and a far field image of the beam can be reduced in size, so that the beam can be efficiently coupled to the absorption layer 240 of the photodetector, as mentioned before. Accordingly, the photodetector, like the aforementioned example, can enjoy a satisfactory photocurrent. It was confirmed that the reflector and photodetector characteristics obtained are similar to those of the element structure described with reference to FIG. 7.

The following is a description of a multifunctional optical integrated device according to a fifth embodiment of the present invention. In this optical integrated device, an electro-absorption optical modulator is monolithically integrated with the optical integrated device of the element structure shown in FIGS. 7, 8A and 8B, that is, the semiconductor lasers provided with the photodetectors.

Figure 9:
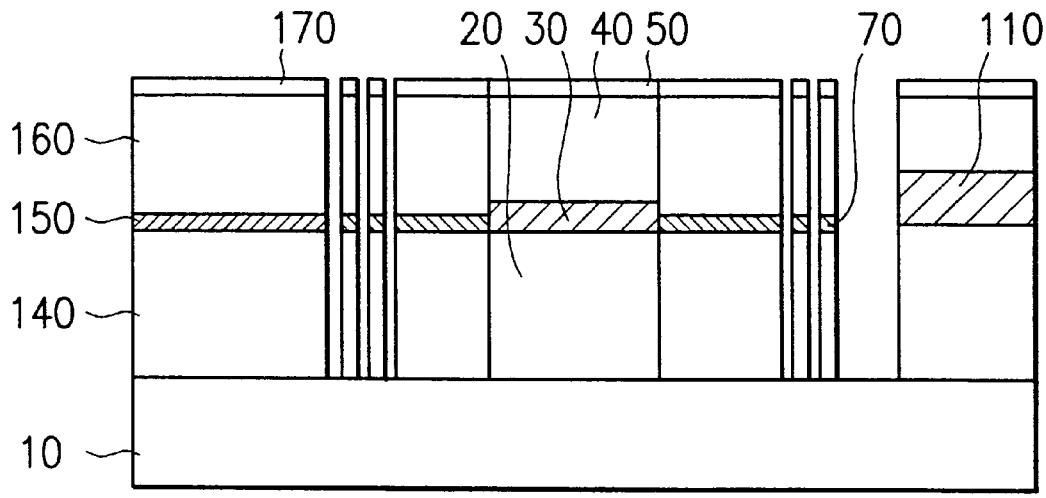
FIG. 9 is a view showing an optical integrated device according to a fifth embodiment of the invention, composed of a semiconductor laser, optical modulator, and photodetector monolithically integrated with a butt-joint structure.

This multifunctional optical integrated device comprises the optical integrated device, in which the laser cavity, provided with the reflection multilayer on the n-InP substrate 10, and the photodetector are monolithically integrated, as shown in FIG. 7, and besides, the optical modulator formed with a butt-joint structure on the same n-InP substrate 10 by the MOCVD method, as shown in FIG. 9.

In forming the multifunctional optical integrated device, the laser cavity, reflector, and photodetector of the semiconductor multilayer, in which the laser and its reflector and the photodetector are formed on the n-InP substrate 10, as shown in FIG. 7, are masked individually, the remaining region of the multilayer is removed to expose the substrate 10 by etching, and a region for the formation of the optical modulator is set on the substrate 10. Thereafter, a semiconductor multilayer to form the modulator is grown on the set region.

The semiconductor multilayer for the optical modulator is formed in a manner such that it is grown with a butt-joint structure on the semiconductor multilayer that constitutes a reflector layer on the front side of the semiconductor laser by the MOCVD method. More specifically, an n-InP cladding layer 140 of 2-μm thickness, modulator optical attenuation layer 150 of 0.2-μm thickness, p-InP cladding layer 160 of 2-μm thickness, and p-GaInAs cap layer 170 of 0.3-μm thickness are successively grown over the etched region on the n-InP substrate 10, as shown in FIG. 9, for example.

In this case, the bandgap energy (Emod) of the modulator attenuation layer 150 is set so as to be smaller than that (Ewg) of the aforesaid reflector waveguide layer 70 and greater than that (Eac) of the laser active layer 30. As mentioned before, the bandgap energy (Eac) of the active layer 30 is greater than that (Epd) of the photodetector absorption layer 110. Accordingly, the respective bandgap energies Ewg, Emod, Eac and Epd of these layers have relations Ewg>Emod>Eac>Epd.

Owing to these relation (Ewg>Emod>Eac>Epd) between the bandgap energies of the individual layers, a laser beam emitted from the rear end face of the laser active layer 30 can be efficiently absorbed by the photodetector 110, so that the photodetector can enjoy a satisfactory photocurrent. On the other hand, a laser beam emitted from the front end face of the active layer 30 is efficiently introduced into the modulator attenuation layer 150, and its absorption rate (transmittance) is adjusted and modulated depending on an electrical field applied to the optical modulator.

In the element structure described above, moreover, the thicknesses Twg, Tmod, Tac and Tpd of the reflector waveguide layer 70, modulator attenuation layer 150, laser active layer 30, and photodetector absorption layer 110 are adjusted to 0.1 μm, 0.2 μm, 0.3 μm, and 0.5 μm, respectively, and they have relations Twg<Tmod<Tac<Tmod. According to these relations, the spot size of the laser beam in the reflector waveguide layer 70, the reflector region, is increased, so that a far field image of the beam can be reduced in size, and the laser beam can be efficiently coupled to the absorption layer 110 of the photodetector. Thus, the photodetector can enjoy a satisfactory photocurrent. Since the laser beam can be also efficiently coupled to the optical attenuation layer 150 of the optical modulator, moreover, the modulator can efficiently modulate the beam.

As a high-speed modulation characteristic (extinction characteristic) of the electro-absorption optical modulator that modulates the laser beam emitted from the front end face of the laser, an extinction ratio of 10 dB or more was obtained compared to a modulation voltage of 2 V applied to the modulator.

Figure 10A:
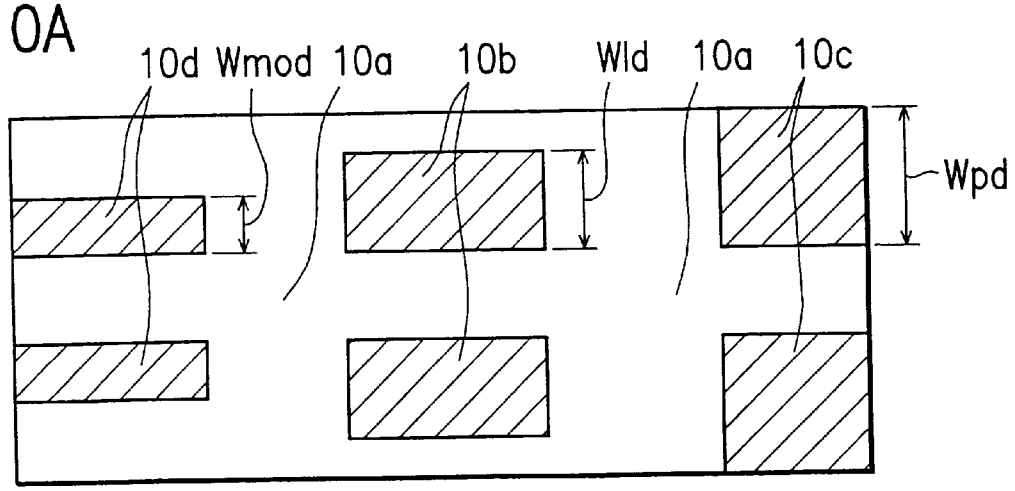
FIG. 10A is a view showing an example of a pattern of a selective growth mask used in selective vapor growth of a semiconductor multilayer in a manufacturing method for an optical integrated device according to a sixth embodiment of the invention, composed of a semiconductor laser, optical modulator, and photodetector integrated monolithically.
Figure 10B:
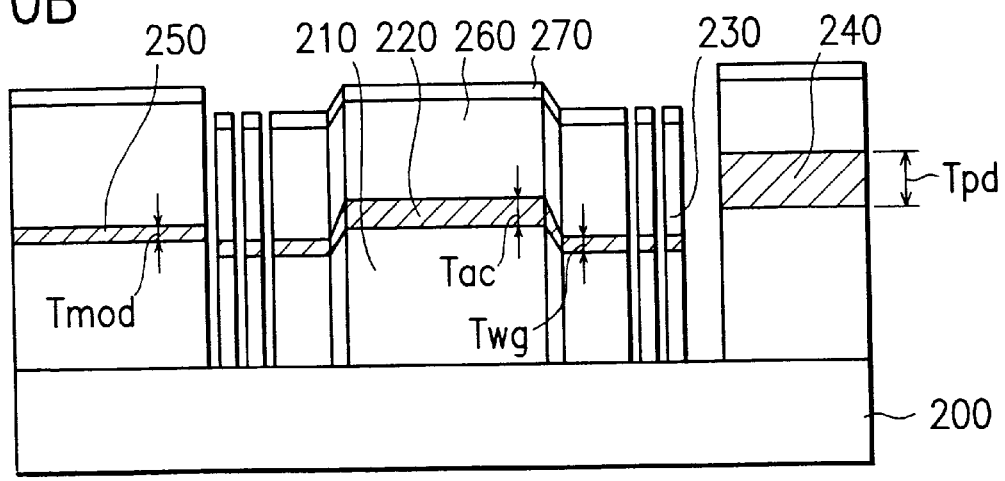
FIG. 10B is a view showing an arrangement of the optical integrated device composed of the semiconductor laser with the photodetector and the optical modulator, formed by the selective growth technique using the selective growth mask shown in FIG. 10A.

A multifunctional optical modulator that integrates the optical modulator of this type can be manufactured by the aforementioned selective vapor growth of a semiconductor laser using a selective growth mask. FIGS. 10A and 10B show an optical integrated device according a sixth embodiment of the present invention, as an example of this arrangement. In manufacturing this device, a selective growth mask of SiN with a thickness of 100 nm is first formed on an n-InP substrate 200.

As shown in FIG. 10A, this selective growth mask is composed of a mask pattern including no-mask portions 10a in a region where reflectors are to be formed, first mask portions 10b in a region where semiconductor lasers are to be formed, second mask portions 10c in a region where photodetectors are to be formed, and third mask portions 10d in a region where optical modulators are to be formed. The first mask portions 10b are formed individually having a pair of first selective growth masks with the width Wld on either side of the region for the formation of the semiconductor lasers. The second mask portions 10c are formed individually having a pair of third selective growth masks with the width Wpd on either side of the region for the formation of the photodetectors. Further, the third mask portions 10d are formed individually having a pair of fourth selective growth masks with a width Wmod on either side of the region for the formation of the optical modulators. The respective widths Wld, Wpd and Wmod of the first, third, and fourth selective growth masks have relations Wpd>Wld>Wmod.

Also in this case, a pair of second selective growth masks that are narrower than the first ones may be arranged with the region for the formation of the reflectors between them.

A semiconductor multilayer is grown on the n-InP substrate 200 by the MOCVD method using the first, third, and fourth selective growth masks. In forming this semiconductor multilayer, the n-InP cladding layer 210 of 2-μm thickness, the InGaAsP layer 220 of 0.3-μm thickness, including the strain quantum well and the optical confinement layer, the p-InP cladding layer 260 of 2-μm thickness, and the p-GaInAs cap layer 270 of 0.3-μm thickness are grown in the region for the formation of the semiconductor lasers, between the first selective growth masks in the first mask portions 10b, for example.

Due to a difference in the vapor growth rate that depends on the respective widths Wld, Wpd and Wmod (Wpd>Wld>Wmod) of the first, third, and fourth selective growth masks formed in the mask portions 10b, 10c and 10d, respectively, the respective bandgap energies Ewg, Emod, Eac and Epd of the reflector waveguide layer 230, a modulator optical attenuation layer 250, the laser active layer 220, and the photodetector absorption layer 240 have relations Ewg>Emod>Eac>Epd. On account of the differences between these bandgap energies, a laser beam emitted from the rear end face of the laser active layer 220 can be efficiently absorbed by the photodetector absorption layer 240, so that the photodetector 240 can enjoy a satisfactory photocurrent.

If the laser active layer 220 is grown so that its thickness Tac is 0.3 μm, as mentioned before, the respective thicknesses Twg, Tmod, and Tpd of the reflector waveguide layer 230, modulator optical attenuation layer 250, and photodetector absorption layer 240 become 0.1 μm, 0.2 μm, and 0.5 μm, respectively, due to the difference in the vapor growth rate. As a result, the spot size of the laser beam in the reflector waveguide layer 230 is increased, and a far field image of the beam is reduced in size, so that the beam transmitted through the reflector region 230 can be efficiently coupled to the photodetector absorption layer 240. Accordingly, a satisfactory photocurrent is produced in the photodetector 240. On the other hand, a laser beam emitted from the front end face of the laser is modulated at high speed by the electro-absorption optical modulator.

Thus, according the optical integrated devices of the present invention, the bandgap energy Ewg of the reflector portion of the multilayer formed on the end face of the laser cavity is greater than the bandgap energy Eac of the laser active layer, so that the absorption loss in the reflector region can be reduced to about 10 cm$^{-1}$. Since the thickness Twg of the reflector region is smaller than the thickness Tac of the laser active layer region, moreover, the optical confinement coefficient for the reflector region can be lowered. Since the spot size of the laser beam in the reflector region is as large as about 3 μm, furthermore, the diffraction loss in that region can be reduced considerably. In consequence, high-reflectivity reflectors with reflectivity of 99% can be obtained efficiently, the threshold oscillation current of the semiconductor laser can be lowered, and the power consumption can be reduced.

Figure 1:
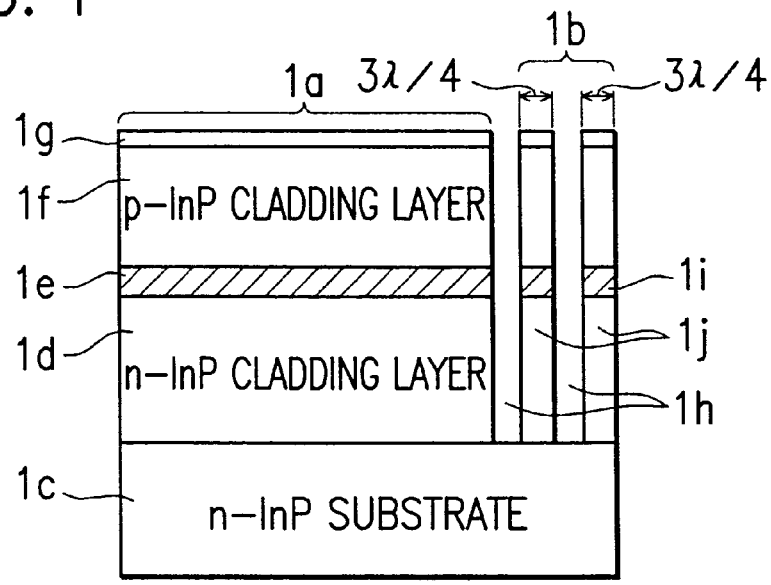
FIG. 1 is a view showing a typical element structure of a semiconductor laser provided with a reflector on its facets.
Figure 2:
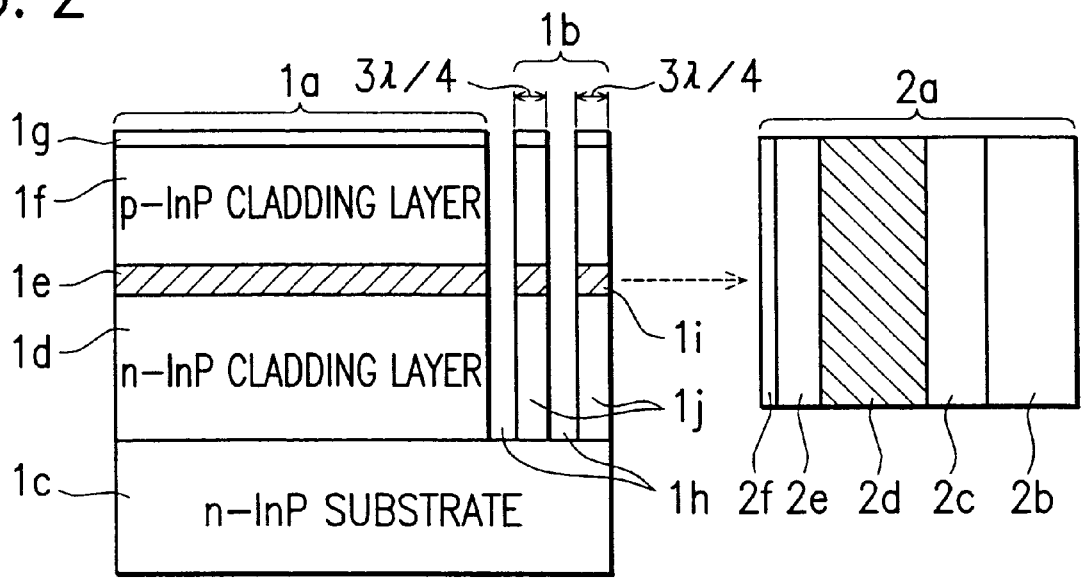
FIG. 2 is a view showing an element arrangement of the semiconductor laser and a photodetector.
Figure 3:
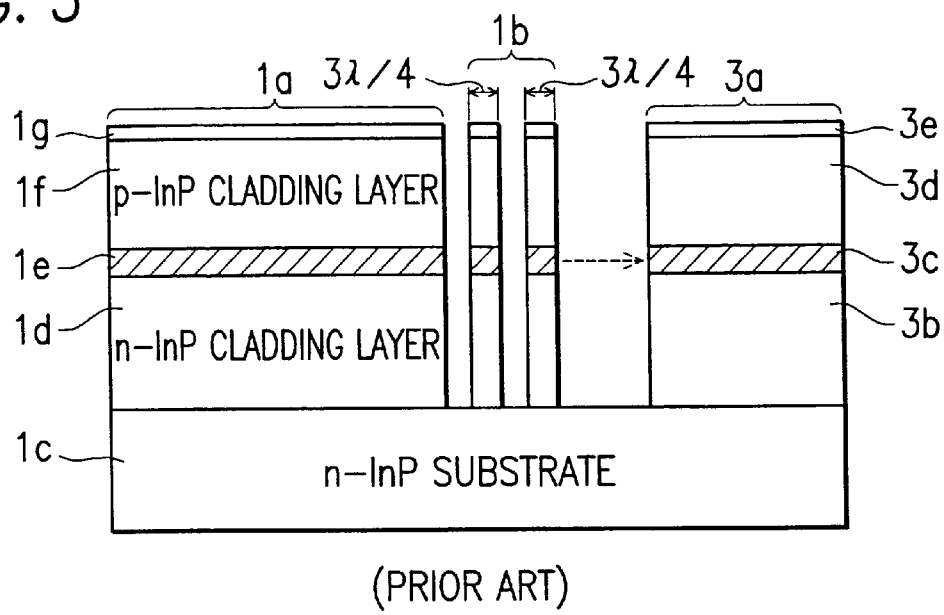
FIG. 3 is a view showing an arrangement of an optical integrated device including the semiconductor laser and a photodetector integrated monolithically.
Figure 4:
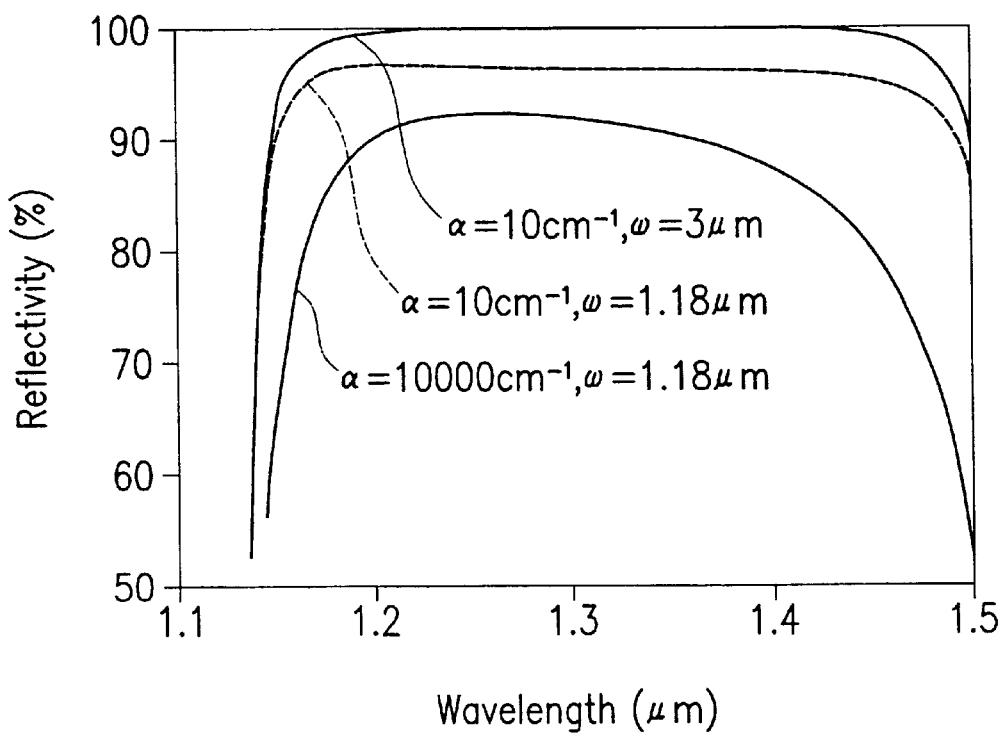
FIG. 4 is a diagram showing calculation results for the reflectivity of a reflector compared with the laser oscillation wavelength, obtained with use of an absorption loss α of the reflector and a spot size ω as parameters.

FIG. 4 shows results of calculation of the reflectivity for the reflectors compared to the laser oscillation wavelength, with absorption loss α and beam spot size ω varied. These calculation results are based on the assumption that the low-refraction layers are formed as air layers having a refractive index of 1, the refractive index of the semiconductor layers is 3.5, the width of each of these layers is 3λ/4, and the reflection multilayer includes the semiconductor layers and the low-refraction layers in two pairs.

According to these calculation results, it was confirmed that the absorption loss in the reflectors according to the invention can be reduced to 10 cm$^{-1}$, although the reflectivity of the reflectors is about 92% in the case where the spot size of a laser beam emitted from a conventional reflector with an absorption loss of 10,000 cm$^{-1}$ is at 1.18 μm. It was theoretically substantiated that the reflectivity of the reflectors can be increased to 96% if the spot size of the beam in the photodetector waveguide layer remains at 1.18 μm. It was also substantiated that the diffraction loss can be reduced to increase the reflectivity to as high as 99% in the case where the absorption loss of the reflectors is reduced to 10 cm$^{-1}$ and the spot size of the laser beam in the photodetector waveguide layer is further increased to 3 μm.

These theoretical calculation results also indicate that the reflectivity of the reflection multilayer formed on the facets of the semiconductor laser can be increased to 99% or more according to the present invention.

According to the invention, moreover, the monolithic integrated device is obtained by forming the semiconductor laser, photodetector, and optical modulator on the single substrate, so that its cost can be lowered favorably. Since the power consumption and threshold oscillation current of the semiconductor laser are reduced or lowered, and the photodetector and the modulator are integrated, the optical integrated device can be easily converted into a multifunctional version.

According to the optical integrated device of the present invention, in particular, the bandgap energy Epd of the photodetector absorption layer is smaller than the bandgap energy Eac of the laser active layer, so that the photocurrent in the photodetector can be increased. Since the spot size of the laser beam in the reflector region can be increased, moreover, the far field image can be reduced in size, and the laser beam can be coupled to the photodetector with higher efficiency. Thus, the sensitivity of the photodetector can be improved.

Since the reflectivity of the reflection multilayer composed of the semiconductor lasers and the low-refraction layers is enhanced, and as the threshold current is lowered, moreover, the threshold current of a semiconductor laser of the ridge-waveguide type of 3-μm width having a reflector with reflectivity of 99%, for example, can be expected to be lowered to 8.5 mA. In a device integrating the low-threshold-current semiconductor laser and a photodetector, the sensitivity of the photodetector can be improved considerably. Furthermore, there may be easily provided a multifunctional optical integrated device, that is, an optical integrated device for high-speed-modulation, large-capacity optical communication, which integrates the low-threshold-current semiconductor, photodetector, and modulator, and enables large-capacity optical communication at low cost.

The present invention is not limited to the embodiments described above. Although the optical integrated device according to each of the foregoing embodiments is formed of an InP-based material, it may be formed of any other suitable material. Although wet etching is used to form the low-refraction layers of the reflection multilayer according to the aforementioned embodiments, it may naturally be replaced with dry etching. It is to be understood, moreover, that the structure of the semiconductor laser is not limited to the ridge-waveguide type, and may alternatively be of the embedded-waveguide type. Furthermore, the reflection multilayers, composed of the semiconductor lasers and the low-refraction layers each, may be arranged in any suitable number according to specifications. In short, various changes and modifications may be effected in the present invention without departing from the scope or spirit of the invention.

What is claimed is:

1. An optical integrated device comprising:
   a semiconductor laser including an active layer interposed between a pair of cladding layers; and
   a reflector provided on the facets of the semiconductor laser and formed of a reflection multilayer obtained by alternately arranging semiconductor layers, each including a waveguide layer interposed between a pair of cladding layers, and low-refraction layers,
   the bandgap energy (Ewg) of the waveguide layer being greater than the bandgap energy (Eac) of the active layer (Eac<Ewg).

2. An optical integrated device comprising:
   a semiconductor laser including an active layer interposed between a pair of cladding layers; and
   a reflector provided on the facets of the semiconductor laser and formed of a reflection multilayer obtained by alternately arranging semiconductor layers, each including a waveguide layer interposed between a pair of cladding layers, and low-refraction layers,
   the thickness (Twg) of the waveguide layer being smaller than the thickness (Tac) of the active layer (Tac>Twg).

3. The optical integrated device according to claim 1 or 2, wherein the respective thicknesses of said low-refraction layers and said semiconductor layers constituting said reflection multilayer are adjusted to about (2N+1)λ/4n (where n is the refractive index of a medium, λ is a wavelength, and N is an integer) each.

4. The optical integrated device according to claim 1, wherein said semiconductor laser and said reflection multilayer are formed on a single semiconductor substrate, the bandgap energy (Eac) of said active layer is smaller than the bandgap energy (Ewg) of the waveguide layer (Eac<Ewg), and the thickness (Tac) of said active layer is greater than the thickness (Twg) of said waveguide layer (Tac>Twg).

5. A method for manufacturing the optical integrated device according to claim 1, 2 or 4, comprising:
   providing a pair of selective growth masks only on either side of a region in which the semiconductor laser on a single semiconductor substrate is to be formed and forming semiconductor layers on the semiconductor substrate by selective vapor growth with use of the selective growth masks, thereby forming the active layer and the waveguide layer; or
   providing a pair of first selective growth masks on either side of the region in which the semiconductor laser on the semiconductor substrate is to be formed, providing a pair of second selective growth masks narrower than the first selective growth masks on either side of a region in which the reflection multilayer on the semiconductor substrate is to be formed, and forming semiconductor layers on the substrate by selective vapor growth with use of the first and second selective growth masks, thereby forming the active layer and the waveguide layer.

6. The optical integrated device according to claim 4, which further comprises a photodetector formed on said semiconductor substrate and including an optical absorption layer interposed between a pair of cladding layers, and wherein the bandgap energy (Epd) of said optical absorption layer is smaller than the respective bandgap energies (Eac, Ewg) of said active layer and said waveguide layer (Ewg>Eac>Epd), and the thickness (Tpd) of said optical absorption layer is greater than the respective thicknesses (Tac, Twg) of said active layer and said waveguide layer (Twg<Tac<Tpd).

7. A method for manufacturing the optical integrated device according to claim 6, comprising:

providing a pair of first selective growth masks and a pair of third selective growth masks on either side of regions in which the semiconductor laser and the photodetector on the semiconductor substrate are to be formed, respectively, without masking the opposite sides of a region in which the reflection multilayer on the semiconductor substrate is to be formed, and forming semiconductor layers on the semiconductor substrate by selective vapor growth with use of the first and third selective growth masks, thereby forming the active layer, waveguide layer, and optical absorption layer, the width (Wld) of the first selective growth masks being smaller than the width (Wpd) of the third selective growth masks (Wld<Wpd).

8. The optical integrated device according to claim 4 or 6, which further comprises an optical modulator formed on said semiconductor substrate and including an optical attenuation layer interposed between a pair of cladding layers, and wherein the bandgap energy (Emod) of said optical attenuation layer is greater than the bandgap energy (Eac) of said active layer and smaller than the bandgap energy (Ewg) of said waveguide layer (Ewg>Emod>Eac), and the thickness (Tmod) of said optical attenuation layer is smaller than the thickness (Tac) of the said active layer and greater than the thickness (Twg) of said waveguide layer (Twg<Tmod<Tac).

9. A method for manufacturing the optical integrated device according to claim 8, comprising:

providing a pair of first selective growth masks and a pair of fourth selective growth masks on either side of regions in which the semiconductor laser and the photodetector are to be formed, respectively, without masking the opposite sides of a region in which the reflection multilayer on the semiconductor substrate is to be formed, and forming semiconductor layers on the semiconductor substrate by selective vapor growth with use of the first and fourth selective growth masks, thereby forming the active layer, waveguide layer, and optical attenuation layer, the width (Wld) of the first selective growth masks being greater than the width (Wmod) of the fourth selective growth masks (Wmod<Wld).

* * * * *